United States Patent
Tsumura

(10) Patent No.: US 8,274,830 B2
(45) Date of Patent: Sep. 25, 2012

(54) CONSTANT CURRENT READ MODE OR CONSTANT CURRENT DATA RETENTION MODE NONVOLATILE MEMORY DEVICE

(75) Inventor: Kazuhiro Tsumura, Chiba (JP)

(73) Assignee: Seiko Instruments Inc. (JP)

( * ) Notice: Subject to any disclaimer, the term of this patent is extended or adjusted under 35 U.S.C. 154(b) by 209 days.

(21) Appl. No.: 12/462,910

(22) Filed: Aug. 11, 2009

(65) Prior Publication Data

US 2010/0046298 A1 Feb. 25, 2010

(30) Foreign Application Priority Data

Aug. 12, 2008 (JP) .................. 2008-208178

(51) Int. Cl.
 *G11C 11/34* (2006.01)
 *G11C 16/04* (2006.01)
(52) U.S. Cl. .......... 365/185.18; 365/185.29; 365/185.28
(58) Field of Classification Search ............. 365/185.18, 365/185.28, 185.29
See application file for complete search history.

(56) References Cited

OTHER PUBLICATIONS

Patent Abstracts of Japan, publication No. 2003-229498, publication date Aug. 15, 2003.
Patent Abstracts of Japan, publication No. 2006-331587, publication date Dec. 7, 2006.

*Primary Examiner* — Huan Hoang
*Assistant Examiner* — Kretelia Graham
(74) *Attorney, Agent, or Firm* — Adams & Wilks

(57) ABSTRACT

A non-volatile semiconductor memory circuit capable of improving data retention characteristics and decreasing an area thereof comprises a constant current circuit and a non-volatile memory cell connected in series. A connection point between the constant current source and the non-volatile memory cell is selected to be an output to thereby enable writing, in a reading mode or a retention mode, in the non-volatile memory cell which is in a write state. The non-volatile semiconductor memory circuit includes a power supply for data reading and retaining and a power supply for data rewriting which are provided independently, and a transistor connected between the output and the power supply for data rewriting, in which the transistor is brought into conduction state when data is rewritten.

5 Claims, 5 Drawing Sheets

CONSTANT CURRENT READ MODE OR CONSTANT CURRENT DATA RETENTION MODE NONVOLATILE MEMORY DEVICE

BACKGROUND OF THE INVENTION

1. Field of the Invention

The present invention relates to a non-volatile semiconductor memory circuit, in particular to an improvement of data retention characteristics.

2. Description of the Related Art

In a non-volatile semiconductor memory cell which stores data by varying a threshold voltage of a transistor through injection of charges into a floating gate, data retention characteristics in a reading mode and a retention mode have been regarded as a problem since an application of a certain voltage, which is smaller than an applied voltage for writing, to the non-volatile memory cell both in the reading mode and the retention mode causes extremely slight writing or erasing.

Also, there occurs a phenomenon that electrons stored in the floating gate escape therefrom not due to an electric field caused by a voltage but due to a thermal energy of the electrons. Continual occurrence of the phenomenon, whose probability is extremely low, may cause a change of a data in ten years, which is thought to be a typical lifetime for consumer products. In order to prevent the change of a data as described above, various means are employed.

For example, there is a method of preventing data from being rewritten by storing data read from a non-volatile memory cell in a latch circuit, and then preventing a current flow through the non-volatile memory cell or applying such a bias as not to generate a voltage difference. In this case, writing and/or erasing of a data by a voltage can be prevented, but there still remains a problem of escape of the stored electrons due to their thermal energy. Accordingly, there is employed a method of making an insulating film thicker to increase energy required for the electrons to escape from the floating gate.

Alternatively, there is a method of changing a bias condition in a retention mode between a non-volatile memory cell in which charges are stored in a floating gate and a cell in which charges are not stored. In this case, retention characteristics of the non-volatile memory cell in which the electrons are stored in the floating gate are improved drastically by injecting the electrons (for example, see JP 2006-331587 A (FIG. 1)).

Further, since a relatively high voltage is necessary for writing of a data, a dedicated device having a high withstanding voltage is required, which is a cause of increase in the number of manufacturing steps, that is, increase in cost therefor. Particularly in a case where a non-volatile memory is used in trimming of an analog value, a memory size of 10 bits is required at most in many cases. Thus, addition of the dedicated device having high withstanding voltage only for the small-size memory is a cause of significant decrease in cost competitiveness of a semiconductor integrated circuit device (for example, see JP 2003-229498 A (FIG. 1)).

In the method of JP 2006-331587 A, an output from the memory is stored in a latch circuit, and an output from the latch circuit is fed back to an input to a memory circuit, thereby improving retention characteristics. However, in this case, the number of elements becomes large, and actual application to the semiconductor integrated circuit device increases a chip size, decreasing cost competitiveness.

In the method of JP 2003-229498 A, a writing select transistor and a reading select transistor are provided in parallel for suppressing fluctuations in a threshold voltage during writing and reducing power consumption during reading. However, a power supply line is the same in reading and writing, and thus the writing and reading select transistors need to be formed of a transistor which can undergo an application of high-voltage during writing. In general, compared with a transistor having lower withstanding voltage, a transistor having higher withstanding voltage shows poor characteristics, and for example, has a smaller drivability and a larger size. When the transistors are formed in a process conforming to the withstanding voltage of the writing select transistor, it is difficult to obtain a transistor having excellent characteristics during reading.

SUMMARY OF THE INVENTION

A non-volatile semiconductor memory circuit according to the present invention adopts the following means for solving the above-mentioned problems.

The present invention provides a non-volatile semiconductor memory circuit comprising: a non-volatile memory cell which stores data; and a constant current circuit connected in series with the non-volatile memory cell, a connection point therebetween being set to be an output, wherein a difference in a threshold voltage of the non-volatile memory cell between an erase state and a write state is used, and in a reading mode or a retention mode, a voltage applied between a source and a drain of the non-volatile memory cell is made to be small in a case where the non-volatile memory cell is in the erase state, whereas the voltage applied between the source and the drain of the non-volatile memory cell is made to be large in a case where the non-volatile memory cell is in the write state, to thereby allow writing in the non-volatile memory cell which is in the write state, in the reading mode or the retention mode.

The present invention provides the non-volatile semiconductor memory circuit further comprising: a power supply line used in the reading mode and the retention mode; another power supply line which is provided separately from the power supply line and is used in data rewriting of the non-volatile memory cell; and a transistor provided between the output and the another power supply line used in the data rewriting of the non-volatile memory cell, wherein the transistor is brought into conduction state at a time of the data rewriting of the non-volatile memory cell.

A current constantly flows through a circuit formed of the constant current circuit and the non-volatile memory cell which are connected in series when power is turned on.

In the reading mode or the retention mode, the voltage applied between the source and the drain of the non-volatile memory cell which is in the erase state is almost zero, and thus energy of electrons flowing through a channel is extremely low. Accordingly, the electrons cannot pass through a barrier between a silicon substrate and a gate insulating, film directly from the channel. In addition, the energy of the electrons flowing through the channel is low, and hence a phenomenon in which electron-hole pairs are generated does not occur along with impact ionization in the vicinity of the drain. For those reasons, data is not rewritten.

Meanwhile, in the reading mode or the retention mode, a high voltage corresponding to an amount of the power supply voltage VDD is applied between the source and the drain of the non-volatile memory cell which is in the write state. As a result, the electrons flowing through the channel become hot, and a part thereof passes through the barrier between the silicon substrate and the gate insulating film to be injected into the floating gate. In addition, electron-hole pairs are generated along with the impact ionization in the vicinity of the drain. A part of the generated electrons of the pairs passes through the barrier between the silicon substrate and the gate insulating film or tunnels therethrough to be injected into the floating gate.

Generally, in a case where a large amount of electrons are stored in the floating gate, the electrons pass through a potential barrier or tunnel therethrough to escape due to an effect of an electric field or due to some of the electrons having high thermal energy. Accordingly, the number of electrons stored in the floating gate tends to decrease with a lapse of time. For this reason, the number of electrons that the non-volatile memory cell which is in the write state stores in the floating gate decreases with a lapse of time.

However, as described above, in the non-volatile memory cell which is in the write state, the electrons are injected into the floating gate in the reading mode or the retention mode, whereby the electrons which escape from the floating gate are replenished. Accordingly, data is less likely to be rewritten.

Further, there can be obtained a semiconductor non-volatile memory circuit which is formed of a fewer number of devices and has improved retention characteristics.

Owing to the characteristics described above, in the non-volatile memory circuit according to the present invention, memory information is not rewritten even when reading is performed continuously. In this case, the current of the constant current circuit constantly flows through the non-volatile memory cell which is in the erase state. In this manner, the current is caused to flow constantly to continuously output the memory information, whereby a mechanism of storing the memory information in a latch circuit or the like becomes unnecessary. As a result, it becomes possible to decrease an area of the non-volatile memory circuit. Moreover, when power is turned on, it is possible to avoid an unstable operating state until data is stored in the latch circuit.

DETAILED DESCRIPTION OF THE PREFERRED EMBODIMENTS

Figure 1:
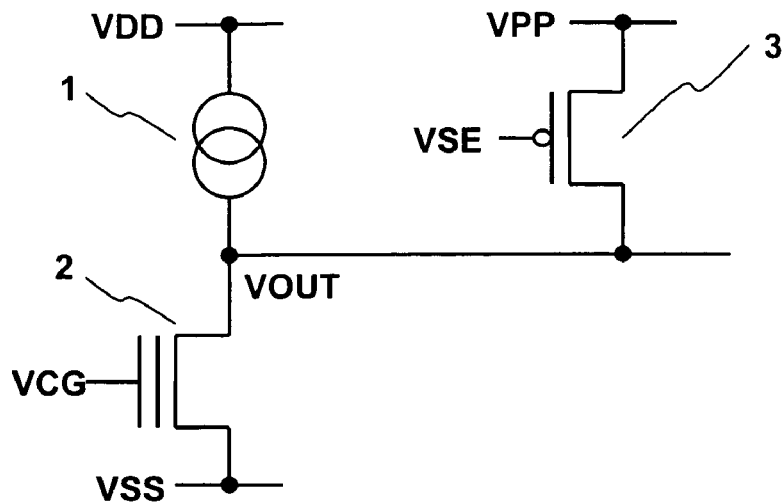
FIG. 1 illustrates a one-bit memory circuit according to preferred embodiments for carrying out the present invention.

The present invention is described with reference to FIG. 1. A constant current circuit 1 is arranged on a VDD line side, a non-volatile memory cell 2 is arranged on a VSS line side, and the constant current circuit 1 and the non-volatile memory cell 2 are connected in series with each other. A connection point therebetween is set to be an output, and its output voltage is denoted by reference symbol VOUT. Through the connection point, the constant current circuit 1 and the non-volatile memory cell 2 are connected to a writing power supply via a writing select transistor 3. A control gate voltage of the non-volatile memory cell 2 and a gate input voltage of the writing select transistor 3 are denoted by reference symbols VCG and VSE, respectively.

The non-volatile memory cell 2 has an n-type MOS transistor structure using a floating gate. The non-volatile memory cell 2 stores a large amount of electrons in the floating gate in a write state, and stores only a small amount of electrons in the floating gate in an erase state. For this reason, a threshold voltage of the non-volatile memory cell 2 is large in the write state and small in the erase state.

Accordingly, in the reading mode or in the retention mode, the control gate voltage VCG of the non-volatile memory cell 2 and a current of the constant current circuit 1 may be set to satisfy the following condition:

"saturation current of non-volatile memory cell in write state"<"constant current of constant current circuit"<"saturation current of non-volatile memory cell in erase state".

When the constant current and the control gate voltage VCG which satisfy the above-mentioned condition are applied in a reading mode, the low output voltage VOUT is output in a case where the non-volatile memory cell 2 is in the write state, and the high output voltage VOUT is output in a case where the non-volatile memory cell 2 is in the write state. A bias state in this case is described in detail with reference to FIG. 2.

Figure 2:
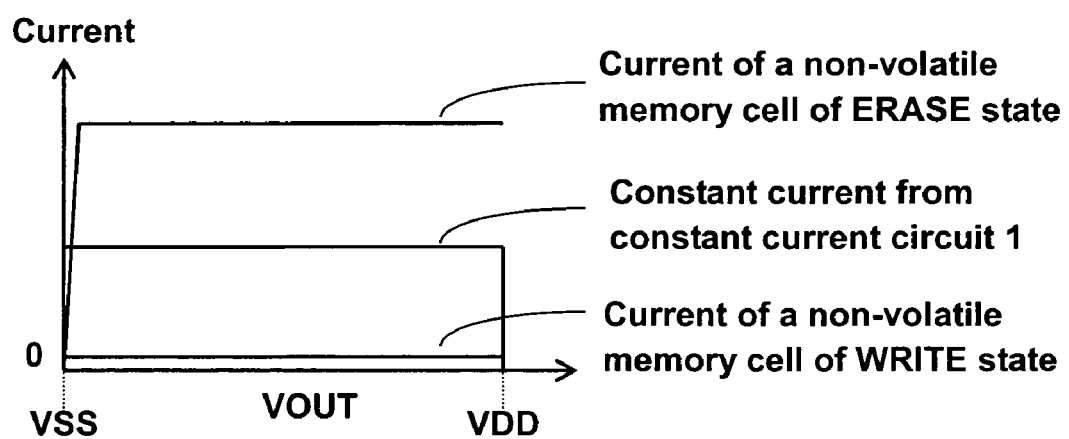
FIG. 2 is a graph illustrating a relationship between a voltage and a current of a constant current circuit and a non-volatile memory cell.

FIG. 2 illustrates current characteristics of the non-volatile memory cell 2 in the erase state and the write state and the constant current circuit 1 as a function of the output voltage VOUT. In the case where the non-volatile memory cell 2 is in the erase state, the saturation current that the non-volatile memory cell 2 can cause to flow is larger than the constant current of the constant current circuit 1 based on the above-mentioned condition. On this occasion, currents flowing through the constant current circuit 1 and the non-volatile memory cell 2 which are connected in series need to be the same, and thus the output voltage VOUT is substantially equal to a power supply voltage VSS which is lower than a power supply voltage VDD.

Accordingly, a voltage applied to the non-volatile memory cell 2 is almost zero in the erase state. In this case, energy of electrons flowing through a channel of the non-volatile memory cell 2 is extremely low. For this reason, channel hot electrons are not injected into the floating gate of the non-volatile memory cell 2. In addition, electron-hole pairs are not generated in the vicinity of a drain thereof, whereby the electrons are not injected into the floating gate thereof.

Next, a case where the non-volatile memory cell 2 is in the write state is described. In this case, the saturation current that the non-volatile memory cell 2 can cause to flow is smaller than the constant current. When the output voltage VOUT is equal to the power supply voltage VDD higher than the power supply voltage VSS, a voltage difference therebetween is zero, whereby the constant current is zero as well. Accordingly, in the write state, the currents flowing through the constant current circuit 1 and the non-volatile memory cell 2 which are connected in series are equal to each other, and thus the output voltage VOUT is substantially equal to the power supply voltage VDD. On this occasion, a voltage substantially equal to the power supply voltage VDD is applied to the non-volatile memory cell 2, whereby the electrons flowing through the channel of the non-volatile memory cell 2 become hot electrons. As a result, the electrons are injected into the floating gate of the non-volatile memory cell 2, that is, writing is performed. The electrons are injected mainly as follows. The injection of the hot electrons is mainly performed as follows. That is, the hot electrons flowing through the channel directly pass through a barrier between a silicon substrate and an insulating film, and a part of the electrons, generated in a large amount along with the generation of electron-hole pairs in the vicinity of the drain, is injected.

In general, the electrons stored in the floating gate escape from the floating gate due to an electric field, thermal excitation, or the like, and thus the number of electrons stored in the floating gate decreases with a lapse of time. Here, the non-volatile memory cell 2 is in the write state, that is, in the state where the electrons are stored in the floating gate, whereby writing in the reading mode is performed toward an improvement in data retention characteristics.

As described above, a voltage to be applied to the non-volatile memory cell changes considerably in accordance with information stored in the non-volatile memory cell. Then, in response to the voltage applied to the non-volatile memory cell, writing is performed on the non-volatile memory cell which is in the write state. Accordingly, there can be realized a non-volatile memory circuit which has improved data retention characteristics with a small area.

The writing select transistor 3 is turned on, and then the power supply voltage VSS is applied to a substrate and a source of the non-volatile memory cell 2 while a voltage VPP is applied to a drain thereof. As a result, writing is performed. A VPP line is for applying a writing voltage larger than the power supply voltage VDD, and is provided separately from the VDD line. The voltage VPP is set to be independent of other voltages in this manner, and hence there is no need to make a withstanding voltage of the entire semiconductor integrated circuit device corresponding to the voltage VPP. When the withstanding voltage is low, a transistor, a device isolation region, and the like can be reduced in size, with the result that the entire semiconductor integrated circuit device can be downsized. As a result, there can be obtained a semiconductor integrated circuit device whose cost competitiveness is high.

A potential difference between a source and a drain becomes larger when the voltage VPP is increased, and thus energy of electrons flowing through a channel increases. As a result, more electrons can be stored in the floating gate. Accordingly, there can be obtained improvements in characteristics, such as a reduction in error rate of memory information due to insufficient writing and an improvement in retention characteristics.

First Embodiment

Figure 3:
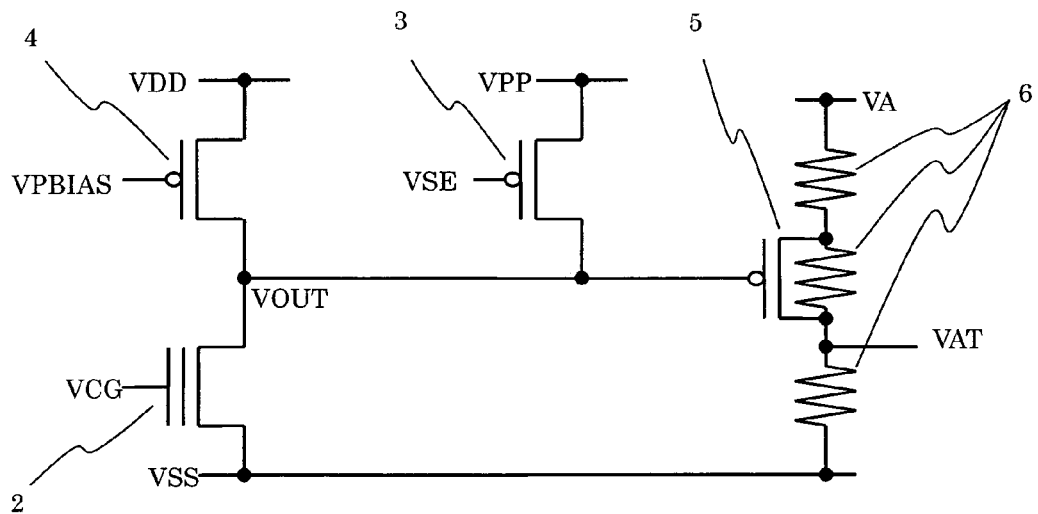
FIG. 3 is a circuit diagram of a one-bit memory circuit including a constant current circuit formed of a p-type transistor, and a trimming circuit according to a first embodiment of the present invention.

Referring to FIG. 3, detailed description is given by describing a size and the like.

A constant current circuit is formed of a p-type transistor 4 and is arranged on a VDD line side, the non-volatile memory cell 2 is arranged on a VSS line side, and the p-type transistor 4 and the non-volatile memory cell 2 are connected in series. A connection point therebetween is set to be an output, and a voltage of the output is denoted by reference symbol VOUT. Through the connection point, the p-type transistor 4 and the non-volatile memory cell 2 are connected to a writing VPP line via the writing select transistor 3. A control gate voltage of the non-volatile memory cell 2, a gate input voltage of the writing select transistor 3, and an input voltage of the p-type transistor 4 are denoted by reference symbols VCG, VSE, and VPBIAS, respectively. A memory circuit is configured as described above.

FIG. 3 illustrates a case where the memory circuit is used in trimming of a voltage VA which is an analog value. A division resistor 6 is used to resistively divide the voltage VA, a trimming transistor 5 is arranged in parallel with a part of the division resistor 6, and the output voltage VOUT is connected to a gate of the trimming transistor 5. The trimming transistor 5 is turned on/off in accordance with storage information of the non-volatile memory cell 2, and hence a resistance division ratio of the voltage VA changes in accordance with the storage information of the non-volatile memory cell 2.

The non-volatile memory cell 2 has an n-type MOS transistor structure using the floating gate. The non-volatile memory cell 2 stores a large amount of electrons in the floating gate in the write state, and stores only a small amount of electrons therein in the erase state. For this reason, the non-volatile memory cell 2 has a high threshold voltage in the write state and a low threshold voltage in the erase state.

Next, the constant current circuit is described. The transistor is generally in the saturated operating state, and has an almost constant value at which a current caused to flow does not depend on a voltage VDS between the source and the drain thereof, when:

$$VG \text{ (gate voltage)} - VTH \text{ (threshold voltage)} < VDS \text{ (voltage between source and drain)} \quad \text{Expression (1)}$$

The above-mentioned phenomenon is used to form the constant current circuit by a p-type transistor and its input voltage VPBIAS.

In the case where the threshold voltage VTH is enhancement, a voltage region of the output voltage VOUT which makes the current constant is a region between VSS and VDD−(PBIAS−VDD−VTH). For example, in a case where VSS is 0 V, VDD is 5 V, VTH is −0.1 V (enhancement), and PBIAS is 4.7 V, a constant current can be obtained when the output voltage VOUT of FIG. 3 falls within a range of 0 V to 4.8 V.

In voltage regions other than the above-mentioned voltage region, Expression (1) is not satisfied, whereby a current largely depends on the voltage VDS between the source and the drain. In this case, a p-type transistor is used as the constant current circuit, but an n-type transistor can similarly form the constant current circuit. Note that in the case of using the n-type transistor, a back gate voltage is applied when the substrate is connected to the power supply voltage VSS, and thus the substrate of the n-type transistor is connected to the output voltage VOUT. Alternatively, it is possible to form the constant current circuit using a plurality of transistors or devices. However, the structure of the constant current circuit is not essential to the present invention, and thus description thereof is not given.

Next, for easier understanding, description is given by describing a specific transistor size and an applied voltage. As to a size of the non-volatile memory cell 2, a channel width and a channel length are 2.0 μm, and a coupling ratio is 0.5, a threshold voltage in the write state is 2.0 V, and a threshold voltage in the erase state is 0 V.

As to a size of the p-type transistor 4 forming the constant current circuit, a channel width and a channel length are 2.0 μm, and a threshold voltage is −0.1 V (enhancement). Thicknesses of a gate insulating film of the n-type non-volatile memory cell 2 and the p-type transistor 4 are 100 Å.

As to the voltages in the reading mode, the power supply voltage VSS is 0 V, the power supply voltage VDD is 5 V, the input voltage PBIAS is 4.7 V, and the control gate voltage is 2 V. The above-mentioned size, threshold voltage voltage, thickness of the gate insulating film, and voltage vary in accordance with an operating voltage of a product to which the present invention is applied and capacity of a manufacturing facility, which are irrelevant to the essence of the present invention.

In the p-type transistor 4, VG (gate voltage)−VTH (threshold voltage)=(PBIAS−VDD)−VTH=−0.2 V. The gate voltage VG is a gate voltage with a source potential as a reference, and thus the above-mentioned relationship is obtained because the source potential is equal to the power supply voltage VDD in the case of the p-type transistor 4.

In the n-type non-volatile memory cell 2 which is in the erase state, VG (gate voltage)−VTH (threshold voltage voltage)=2−0=2 V. Comparing with the p-type transistor 4 forming the constant current circuit, in the n-type transistor, a value obtained by subtracting the threshold voltage VTH from the gate voltage VG is larger by ten times, carrier mobility is generally higher by approximately two times, and coupling ratio is 0.5, while a transistor size is the same. Accordingly, a saturation current of the n-type non-volatile memory cell 2 is larger than a saturation current of the p-type transistor 4 by approximately a hundred times.

Figure 4:
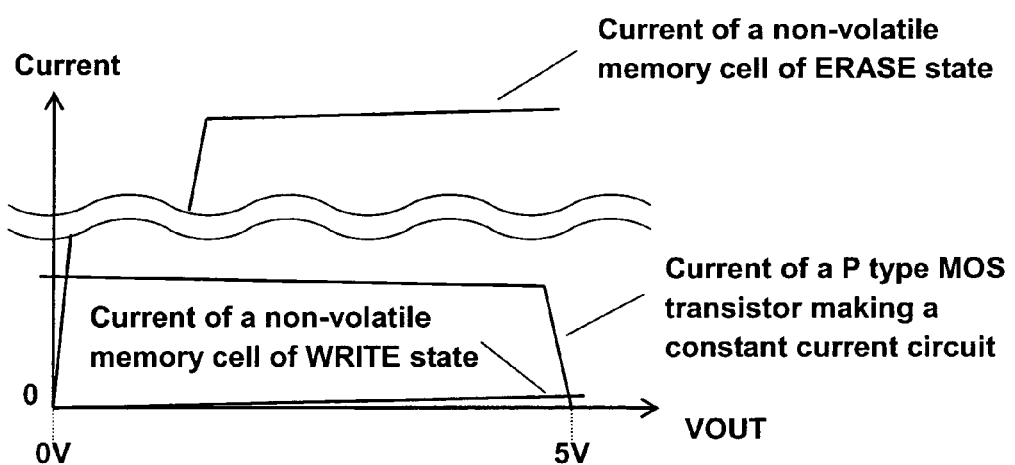
FIG. 4 is a graph illustrating a relationship between a voltage and a current of the constant current circuit formed of the p-type transistor and the non-volatile memory cell.

FIG. 4 illustrates a relationship between a voltage and a current on this occasion. Ideally speaking, the saturation current does not depend on the drain voltage. However, in an actual transistor, the saturation current slightly increases along with an increase in drain voltage, and thus there is a slight tilt in the saturation current of FIG. 4, which is different from FIG. 2. The saturation current flows in the case where VDS>VG−VTH, and a linear current flows in the case where VDS<VG−VTH.

The currents flowing through the non-volatile memory cell 2 and the p-type transistor 4 are equal to each other owing to series connection, whereby in FIG. 4, the output voltage VOUT is indicated by an intersection between the current of the non-volatile memory cell 2 which is in the erase state and the current of the p-type transistor 4 forming the constant current circuit. The saturation current of the n-type transistor is approximately a hundred times larger than the saturation current of the p-type transistor 4, and VG−VTH=2V, whereby the output voltage VOUT is approximately $\frac{2}{100}$=0.02 V (for simplification). Accordingly, energy of electrons flowing through the channel of the n-type non-volatile memory cell 2 is 0.02 eV at most, and the electrons do not have energy enough to pass through the barrier between the silicon substrate and the gate insulating film. For this reason, the electrons are not injected into the floating gate. And the data is not rewritten even by continuously reading the non-volatile memory cell 2 which is in the erase state.

Meanwhile, in the n-type non-volatile memory cell 2 which is in the write state, VG (gate voltage)−VTH (threshold voltage)=0 V with respect to the threshold voltage of 2 V. Accordingly, the current that the n-type non-volatile memory cell 2 may cause to flow is much smaller than the saturation current of the p-type transistor 4. Also in this case, the currents flowing through the non-volatile memory cell 2 and the p-type transistor 4 are equal to each other owing to series connection, whereby in FIG. 4, the output voltage VOUT is indicated by an intersection between the current of the n-type non-volatile memory cell 2 which is in the write state and the current of the p-type transistor 4. Accordingly, the output voltage VOUT is almost 5 V. When the voltage of approximately 5 V is applied to the n-type non-volatile memory cell 2, the electrons flowing through the channel of the n-type non-volatile memory cell 2 have a large amount of energy, and thus extremely slight writing occurs in the floating gate.

Generally, in the n-type non-volatile memory cell 2 which is in the write state, the electrons stored in the floating gate gradually disappear with a lapse of time, and data disappears sooner or later. In other words, data is rewritten. However, the electrons are injected into the floating gate in the reading mode or the retention mode as described above, whereby data retention characteristics are improved.

The state, in which almost no voltage is applied to the non-volatile memory cell which is in the erase state and voltage substantially equal to the power supply voltage is applied to the non-volatile memory cell which is in the write state, can be achieved. In other words, retention characteristics can be improved while minimizing an increase in area.

In addition, the output voltage VOUT is substantially equal to the power supply voltage VSS in the erase state and to the power supply voltage VDD in the write state. For this reason, there is no need to make a comparison with a reference memory cell used in a general memory circuit, and hence a sense amplifier and the reference memory cell become unnecessary, which enables reducing the area correspondingly.

Next, a peripheral circuit is described. The memory circuit according to the present invention has a characteristic that the data is not rewritten even when the reading mode continues, and is thus particularly suitable for trimming of an analog value. Referring to FIG. 3, description is given here of the case where the present invention is applied to the circuit which divides the voltage VA of an analog value by a division resistor.

The trimming transistor 5 is connected in parallel with the division resistor 6 which divides the voltage VA. In the case where the trimming transistor 5 is a p-type transistor, when the output voltage VOUT is low, the trimming transistor 5 formed of a p-type transistor is turned on, whereby the division resistor 6 is short-circuited, whereas when the output voltage VOUT is high, the trimming transistor 5 formed of a p-type transistor is turned off, whereby the division resistor 6 functions.

Here, an on-resistance of the trimming transistor 5 in an on-state needs to be as small as negligible compared with that of the division resistor. Even in the case where the trimming transistor 5 is turned off, a leakage current between a source and a drain thereof or a junction leakage current is generated, and an off-resistance due to those leakage currents needs to be extremely larger compared with that of the division resistor. The trimming transistor which satisfies the above-mentioned two conditions can be easily set by adjusting a channel width, a channel length, and a threshold voltage.

Here, the output voltage VOUT is directly input to the trimming transistor 5, but there may be provided a circuit such as an inverter therebetween for reversing or adjusting data.

Next, a writing operation is described. The input voltage VSE of the writing select transistor 3 is an input for selecting the writing operation. Writing is performed when the writing select transistor 3 is turned on and the voltage VPP is equal to or larger than a voltage required for writing.

In general, high voltage is required for writing in the non-volatile memory cell. Voltage higher than a maximum operating voltage VDDmax of the power supply voltage VDD is required for writing, and a device is configured so as to be endurable even when the high voltage for writing is applied thereto, whereby a withstanding voltage needs to be increased compared with the case where the device is configured in accordance with the maximum operating voltage VDDmax. As a result, characteristics of the device deteriorate, and thus a size thereof increases. Hence the VPP line is provided separately from a line for the power supply voltage VDD as illustrated in FIG. 3. The voltage required for writing is applied only to the VPP line, and a voltage which is equal to or smaller than the maximum operating voltage VDDmax is applied to the VDD line. With this structure, writing can be performed by the voltage VPP on the semiconductor integrated circuit device formed of a device which has a withstanding voltage in accordance with the power supply voltage VDD.

Figure 5:
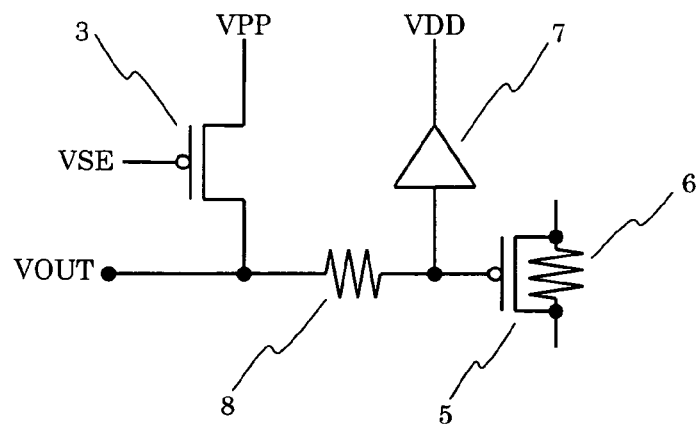
FIG. 5 illustrates a circuit which clamps an input voltage of a trimming transistor to a power supply voltage VDD.

In FIG. 3, the voltage VPP is applied to the gate insulating film of the trimming transistor 5. On the other hand, as illustrated in FIG. 5, a diode 7 and a resistor 8 may be used, to thereby clamp the voltage VPP to the power supply voltage VDD. In the case where the trimming transistor 5 is a p-type and a substrate potential is equal to the power supply voltage VDD, a voltage applied to the insulating film has a value obtained by subtracting the power supply voltage VDD from the voltage VPP. Accordingly, the clamp circuit as described above is not necessary.

The voltage VPP is applied also to the drain of the p-type transistor 4 for constant current. However, PN junction of the drain and the substrate is in a forward direction, and thus a forward current flows from the VPP line to the VDD line when the substrate of the p-type transistor is directly connected to the power supply voltage VDD. The flow of the forward current is avoidable by sandwiching a resistor between the VPP line and the VDD line or separating the substrate of the p-type transistor 4 from the power supply voltage VDD to provide a switch therebetween.

The voltage VPP is applied to the drain of the writing select transistor 3, and thus the writing select transistor 3 needs to have a withstanding voltage equal to the voltage VPP. A drain withstanding voltage of a p-type transistor is generally larger than that of an n-type transistor. Accordingly, a channel length of a transistor may be increased so that a punch-through does not occur due to the voltage VPP. Regarding the channel length, the channel may be increased in length in a mask process, and hence there is no need to change the manufacturing step in accordance with the voltage VPP.

As described above, it is possible to apply the voltage VPP larger than the power supply voltage VDD to the power supply line for writing only in the manufacturing step which is in accordance with the voltage of the power supply line which is used in the reading mode and the retention mode. In other words, there can be obtained a non-volatile semiconductor memory circuit capable of applying a voltage required for sufficient writing without sacrificing transistor characteristics. Herein, the description has been given of the power supply line for writing, but the power supply line may be used also in an erasing operation.

Second Embodiment

Figure 6:
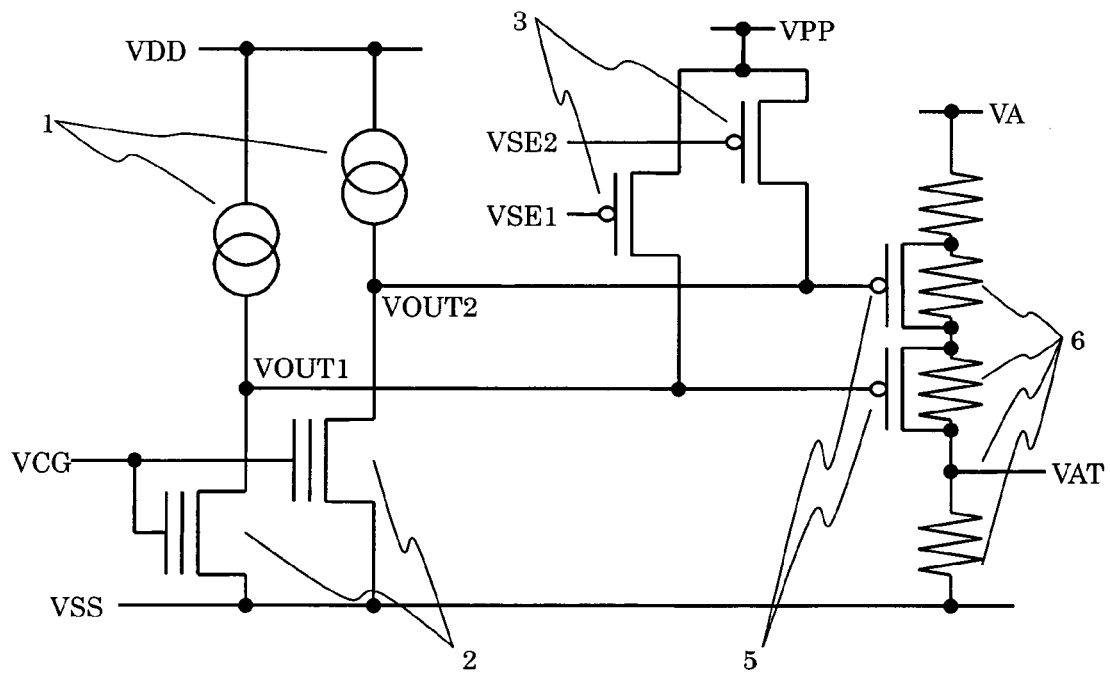
FIG. 6 illustrates a two-bit memory circuit and a trimming circuit.

Description is given with reference to FIG. 6. FIG. 6 is a circuit diagram illustrating a two-bit non-volatile memory circuit 2 and resistive division of the voltage VA. In the case of a plurality of bits, writing is performed only on the non-volatile memory cell 2 in which the writing select transistor 3 is turned on. A transistor for selection is not present in reading, and the output voltages VOUT of the non-volatile memory circuit 2 are respectively input to the trimming transistors formed of p-type transistors, whereby stored data is constantly output. The trimming transistor may be formed of an n-type transistor to function in a similar manner.

The description has been given of the case of two bits, which is for describing the case of a plurality of bits in the simplest manner. It is possible to increase the number of bits to any number in a manner similar to that of this embodiment.

Third Embodiment

Figure 7:
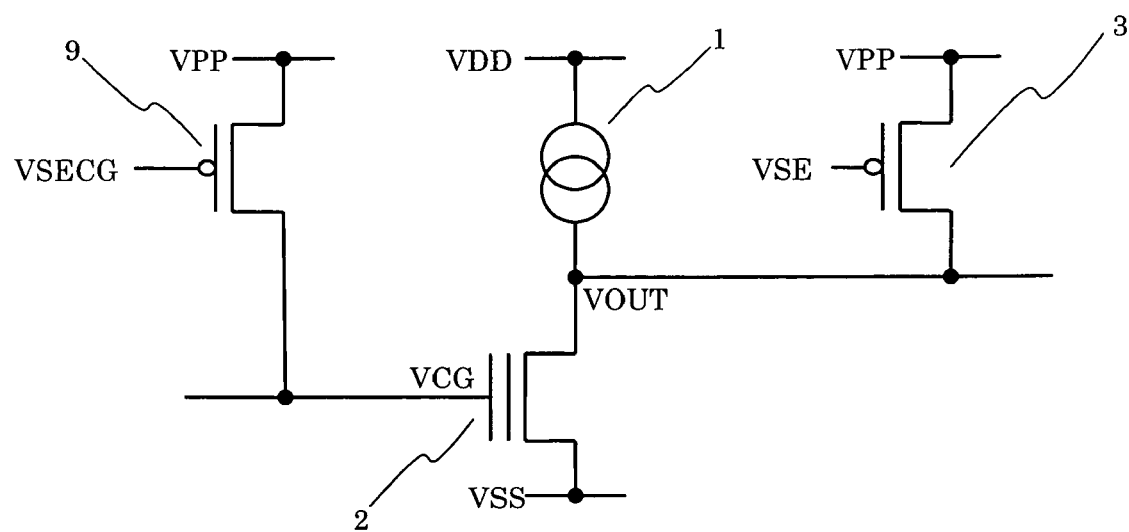
FIG. 7 illustrates a one-bit memory circuit in which a control gate voltage VCG can be connected to a VPP line.

Description is given with reference to FIG. 7. In FIG. 7, the control gate voltage VCG is connected to the VPP line via a select transistor 9 for the control gate voltage VCG. Through this connection, the control gate voltage VCG can be raised to the voltage VPP in writing. The electrons are injected into the floating gate. The electrons have negative charges, and thus, injection efficiency of channel hot electrons can be increased by raising a potential of the floating gate. However, an electric field in the vicinity of the drain becomes weak, and thus a generation amount of electron-hole pairs decreases. Accordingly it cannot be generally said that the injection efficiency in total is excellent when the control gate voltage VCG is raised to the voltage VPP. However, in a case where the injection efficiency in total increases when the control gate voltage VCG is raised to the voltage VPP, the control gate voltage VCG is connected to the VPP line via a switch, to thereby further shift the threshold voltage.

Fourth Embodiment

Figure 8:
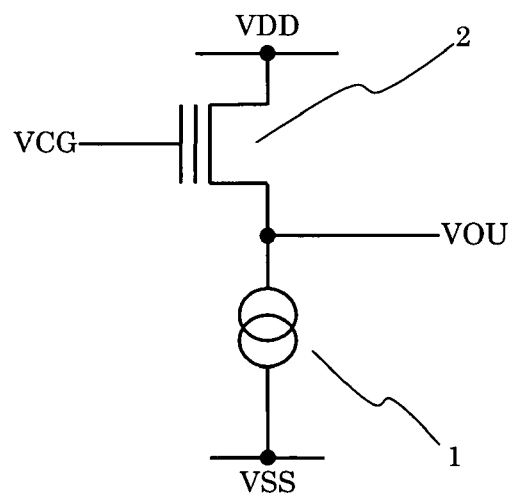
FIG. 8 illustrates a circuit in which a constant current circuit and a non-volatile memory cell are arranged in a manner opposite to FIG. 1.

Description is given with reference to FIG. 8. In FIG. 8, the non-volatile memory cell 2 is arranged on the power supply voltage VDD side, the constant current circuit 1 is arranged on the power supply voltage VSS side, and the non-volatile memory cell 2 and the constant current circuit 1 are connected in series. In a case where an n-type transistor is used for the non-volatile memory cell 2, a substrate of the non-volatile memory cell 2 is connected to the output voltage VOUT so that a back gate voltage is not applied. As a result, the function similar to those of the embodiments described above can be obtained.

Fifth Embodiment

Figure 9:
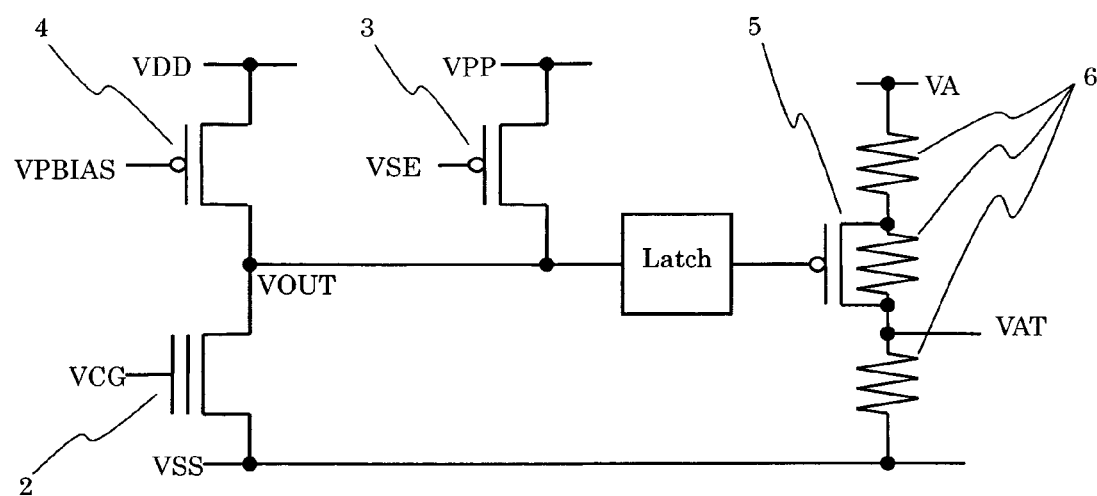
FIG. 9 illustrates a one-bit memory circuit including a latch circuit, and a trimming circuit.

Description is given with reference to FIG. 9. The output voltage VOUT is input to a latch circuit, and an output of the latch circuit is input to the trimming transistor 5. With this structure, memory information can be stored in the latch circuit. Accordingly, a constant current is caused to flow through the constant current circuit when power is turned on to read the information stored in the non-volatile memory cell 2 to the latch circuit, and after that, it is possible to shut off the currents flowing through the non-volatile memory cell 2 and the constant current circuit 1. The current consumption can be reduced by shutting off the currents. Accordingly, the structure according to this embodiment is suitable for a semiconductor integrated circuit device in which a low current consumption takes precedence than others.

Sixth Embodiment

In the embodiments described above, description has been given of the non-volatile memory cell of an n-type MOS transistor structure in which a floating gate is used for a non-volatile memory cell. However, the present invention is not limited thereto. In a p-type MOS transistor structure using a floating gate, the function similar to those of the embodiments described above can be obtained also with a mode in which holes are stored in the floating gate in the write state.

The similar function can be obtained also in a case where a non-volatile memory cell which does not include a floating gate but includes a charge trap type transistor, which causes a trap site of an insulating film to trap charges, is used. As a non-volatile memory cell of a charge trap type transistor, in which charges are trapped into an insulating film, a non-volatile memory cell in which oxide-nitride-oxide (ONO) is used for an insulating film is generally known. In the charge trap type transistor, a fact that a threshold voltage changes in accordance with a trap amount of charges into the insulating film is used for storing data. Accordingly, even when the non-volatile memory cell of the charge trap type transistor is used, the function similar to those of the embodiments as described above can be obtained.

As long as the non-volatile semiconductor memory circuit to be used is a non-volatile semiconductor memory circuit in which a constant current circuit and a non-volatile memory cell are connected in series and a connection point therebetween is set to be an output, the function of the present invention can be obtained even when another device is provided between the power supply voltage VDD and the power supply voltage VSS.

What is claimed is:

1. A non-volatile semiconductor memory circuit, comprising:
    a non-volatile memory cell having an erase state in which a threshold voltage is low and a write state in which the threshold voltage is high to thereby store data;
    a constant current circuit connected in series with the non-volatile memory cell; and
    a connection point between the non-volatile memory cell and the constant current circuit being set to be an output;
    wherein, in a reading mode or a retention mode, in which a voltage is applied to the non-volatile memory cell, the following relationship is satisfied:

$$I_{WRITE} < I_{CONST} < I_{ERASE},$$

where a saturation current flowing through the non-volatile memory cell in the erase state is represented by $I_{ERASE}$, a saturation current flowing through the non-volatile memory cell in the write state is represented by $I_{WRITE}$, and a constant current provided from the constant current circuit is represented by $I_{CONST}$.

2. The non-volatile semiconductor memory circuit according to claim 1, wherein in one of the reading mode and the retention mode:
    in a case where the non-volatile memory cell is in the erase state, a voltage applied between a source and a drain of the non-volatile memory cell is made to be close to 0 V, to thereby prevent writing in the non-volatile memory cell which is in the erase state; and
    in a case where the non-volatile memory cell is in the write state, the voltage applied between the source and the drain of the non-volatile memory cell is made to be close to a power supply voltage higher than another power supply voltage, to thereby allow writing in the non-volatile memory cell which is in the write state by hot electrons.

3. The non-volatile semiconductor memory circuit according to claim 1, further comprising:
    a power supply line used in the reading mode and the retention mode;
    another power supply line which is provided separately from the power supply line and is used in data rewriting of the non-volatile memory cell; and
    a transistor provided between the output and the another power supply line used in the data rewriting of the non-volatile memory cell;
    wherein the transistor is brought into conduction state at a time of the data rewriting of the non-volatile memory cell.

4. The non-volatile semiconductor memory circuit according to claim 1; wherein the constant current flows constantly through a circuit formed of the constant current circuit and the non-volatile memory cell which are connected in series while a power supply voltage is applied to the circuit.

5. The non-volatile semiconductor memory circuit according to claim 1; wherein the constant current circuit comprises a MOS transistor which is in a saturated operating state.

* * * * *